United States Patent
Suekawa

(10) Patent No.: US 7,635,878 B2
(45) Date of Patent: Dec. 22, 2009

(54) SEMICONDUCTOR DEVICE HAVING INSULATED GATE BIPOLAR TRANSISTOR

(75) Inventor: Eisuke Suekawa, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 237 days.

(21) Appl. No.: 11/108,694

(22) Filed: Apr. 19, 2005

(65) Prior Publication Data

US 2005/0253169 A1    Nov. 17, 2005

(30) Foreign Application Priority Data

May 13, 2004    (JP)    ............... 2004-143360
Feb. 21, 2005    (JP)    ............... 2005-043908

(51) Int. Cl.
*H01L 29/737*    (2006.01)
(52) U.S. Cl. ............... 257/197; 257/E29.027; 257/E29.066
(58) Field of Classification Search ............... 257/197, 257/205, 361, 362, 565, E29.027, E29.066, 257/E29.197, E29.382, E21.382, 261, 262, 257/163, 169, 170, 183, 483, 484, E29.012; 438/FOR. 254
See application file for complete search history.

(56) References Cited

U.S. PATENT DOCUMENTS

| | | | |
|---|---|---|---|
| 5,162,876 A | 11/1992 | Kitagawa et al. | |
| 5,200,632 A * | 4/1993 | Sakurai | ............... 257/212 |
| 5,506,153 A | 4/1996 | Brunner et al. | |
| 5,528,058 A * | 6/1996 | Pike et al. | ............... 257/142 |
| 5,556,792 A | 9/1996 | Zambrano | |
| 5,703,385 A | 12/1997 | Zambrano | |
| 6,194,290 B1 * | 2/2001 | Kub et al. | ............... 438/455 |
| 6,323,509 B1 | 11/2001 | Kusunoki | |
| 6,667,515 B2 | 12/2003 | Inoue | |
| 6,774,407 B2 * | 8/2004 | Kushida | ............... 257/131 |
| 2002/0048855 A1 | 4/2002 | Matsudai et al. | |
| 2002/0050603 A1 | 5/2002 | Kawamoto | |
| 2003/0042525 A1 * | 3/2003 | Tanaka | ............... 257/302 |
| 2003/0168718 A1 * | 9/2003 | Matsudai et al. | ............... 257/565 |

(Continued)

FOREIGN PATENT DOCUMENTS

DE    197 20 439    11/1997

(Continued)

*Primary Examiner*—Brook Kebede
(74) *Attorney, Agent, or Firm*—McDermott Will & Emery LLP

(57) ABSTRACT

One of the aspects of the present invention is to provide a semiconductor device, which includes a semiconductor layer of a first conductive type having first and second surfaces. The semiconductor layer includes a base region of a second conductive type formed in the first surface and an emitter region of the first conductive type formed in the base region. Also, the semiconductor device includes a buffer layer of the first conductive type formed on the second surface of the semiconductor layer, and a collector layer of the second conductive type formed on the buffer layer. The buffer layer has a maximal concentration of the first conductive type impurity therein of approximately $5 \times 10^{15}$ cm$^{-3}$ or less, and the collector layer has a maximal concentration of the second conductive type impurity therein of approximately $1 \times 10^{17}$ cm$^{-3}$ or more. Further, the ratio of the maximal concentration of the collector layer to the maximal concentration of the buffer layer being greater than 100. The collector layer has a thickness of approximately 1 μm or less.

8 Claims, 10 Drawing Sheets

U.S. PATENT DOCUMENTS

2005/0258493 A1 * 11/2005 Aono et al. .................. 257/370

FOREIGN PATENT DOCUMENTS

| DE | 102 26 908 | | 2/2003 |
|---|---|---|---|
| EP | 0 423 721 | | 4/1991 |
| JP | 4-240775 | | 8/1992 |
| JP | 9-121052 | | 5/1997 |
| JP | 10-50724 | | 2/1998 |
| JP | 10050724 A | * | 2/1998 |
| JP | 2001-332729 A | | 11/2001 |
| JP | 2002-299623 A | | 10/2002 |

* cited by examiner

SEMICONDUCTOR DEVICE HAVING INSULATED GATE BIPOLAR TRANSISTOR

BACKGROUND OF THE INVENTION

1) Technical field of the Invention

The present invention relates to a semiconductor device used for an inverter device, and in particular, relates to the semiconductor device suppressing an operation of a parasitic transistor, thereby reducing the power loss and improving the ruggedness.

2) Description of Related Arts

An inverter device uses a half-bridge circuit including an Insulated Gate Bipolar Transistor (IGBT) and a Free Wheel Diode reversely connected in parallel. In the art of the present invention, several semiconductor devices used for the inverter device have been proposed.

For example, a Japanese Patent Laid-Open Publication Application JPA 2001-332729 discloses a transistor operating in a bipolar mode which can reduce ON-resistance while reducing a turn-off loss even at high temperature by controlling thickness and peak impurity concentration of an n-type buffer layer and a p-type emitter layer.

Also, according to another Japanese Patent Laid-Open Publication Application JPA 2002-299623, a high breakdown-voltage semiconductor device is proposed, in which the conduction power loss can be stabilized. The ratio of the impurity quantity doped within the n-type buffer layer to the impurity quantity doped within the p-type emitter layer falls within a range from 2.5 through 8.2 so as to reduce the variation of the conduction power loss even when the impurity quantity of those layers substantially vary.

Further, another Japanese Patent Laid-Open Publication Application JPA 04-240775 provides a triode semiconductor device including an emitter short-circuit structure having a buffer layer intervened between an anode-emitter region and a base region, thereby to improve the trade-off relationship between turn-on and turn-off characteristics.

In addition, another Japanese Patent Laid-Open Publication Application JPA 10-050724 suggests an IGBT having a short-lifetime region obtained by an ion radiation, in which the ion radiation is processed substantially across the undepleted region so as to suppress a tail current at a low voltage without reducing the breakdown voltage and increasing leakage current and ON-voltage.

As above, the inverter device used for electric trains or industries incorporates the IGBT of a high breakdown voltage which may exceed 4.5 kV, and includes a fairly thick n-type drift layer for ensuring the high breakdown voltage. Still, a transient ON-voltage applied across the FWD due to the electromotive force of the inductive load may be raised up to several hundreds volts higher than the reverse breakdown voltage of the IGBT, which allows the reverse current from the emitter to collector electrode. Thus, the transient ON-voltage across the FWD may severely affect the induction load operation of the IGBT.

FIG. 14 illustrates a circuit diagram of a conventional power converting circuit incorporating a half-bridge circuit structure. FIG. 15 shows a set of timing diagrams of outputs when the half-bridge circuit structure is used for the induction load.

In the half-bridge circuit structure of FIG. 14, when the IGBT 2 turns off (switching from ON-state to OFF-state, i.e., Stage II to Stage III), a forward voltage is applied across the FWD and a forward current (recovery current) $I_1$ runs through the FWD. Such a forward voltage has the transient voltage up to several hundreds volts, thus, the IGBT 1 having insufficient reverse breakdown voltage may have an avalanche current $I_2$ from the emitter to collector electrode with the transient voltage applied thereto.

After the recovery operation of the FWD, when the IGBT 2 again turns on (switching from OFF-state to ON-state, i.e., Stage III to Stage IV), the avalanche current $I_2$ serves as a base-current of a parasitic pnp transistor (pnp-Tr) triggering the parasitic pnp-Tr current running through the IGBT 1. In conjunction with the recovery current of the FWD, the parasitic pnp-Tr current leads the power loss of the IGBT 1, the turn-off loss of the power converting circuit (IGBT 2), and the recovery loss of the IGBT 1 and the FWD.

The present inventors addresses the aforementioned problems by suppressing the parasitic pnp-Tr current of the IGBT with two approaches as indicated below;

a) The reverse breakdown voltage of the IGBT is improved to suppress the avalanche current $I_2$ of the IGBT 1 generated at the turning-on of the IGBT 2 (Stage III), which serves as the base-current of a parasitic pnp-Tr triggering the parasitic pnp-Tr current of the IGBT 1.

b) Even where the avalanche current $I_2$, i.e., the base-current of the parasitic pnp-Tr is generated, the parasitic pnp-Tr is not likely to be acted or switched on. In particular, the IGBT is provided with a short carrier-lifetime region to the extent not to increase the operating voltage of the IGBT.

SUMMARY OF THE INVENTION

One of the aspects of the present invention is to provide a semiconductor device, which includes a semiconductor layer of a first conductive type having first and second surfaces. The semiconductor layer includes a base region of a second conductive type formed in the first surface and an emitter region of the first conductive type formed in the base region. Also, the semiconductor device includes a buffer layer of the first conductive type formed on the second surface of the semiconductor layer, and a collector layer of the second conductive type formed on the buffer layer. The buffer layer has a maximal concentration of the first conductive type impurity therein of approximately $5 \times 10^{15}$ cm$^{-3}$ or less, and the collector layer has a maximal concentration of the second conductive type impurity therein of approximately $1 \times 10^{17}$ cm$^{-3}$ or more. Further, the ratio of the maximal concentration of the collector layer to the maximal concentration of the buffer layer being greater than 100. The collector layer has a thickness of approximately 1 µm or less.

BRIEF DESCRIPTION OF THE DRAWINGS

The present invention more fully be understood from the detailed description given herein and accompanying drawings which are given by way of illustration only, and thus are not limitative of the present invention.

DETAILED DESCRIPTION OF THE PREFERRED EMBODIMENTS

Referring to the attached drawings, the details of embodiments according to the present invention will be described herein. In those descriptions, although the terminology indicating the directions (for example, "top" and "bottom") are conveniently used just for clarity, should not be interpreted that those terminology limit the scope of the present invention. Also, it should be noted that the conductive type of polarity such as p-type and n-type in the semiconductor can arbitrarily be replaced to each other.

Embodiment 1

Figure 1:
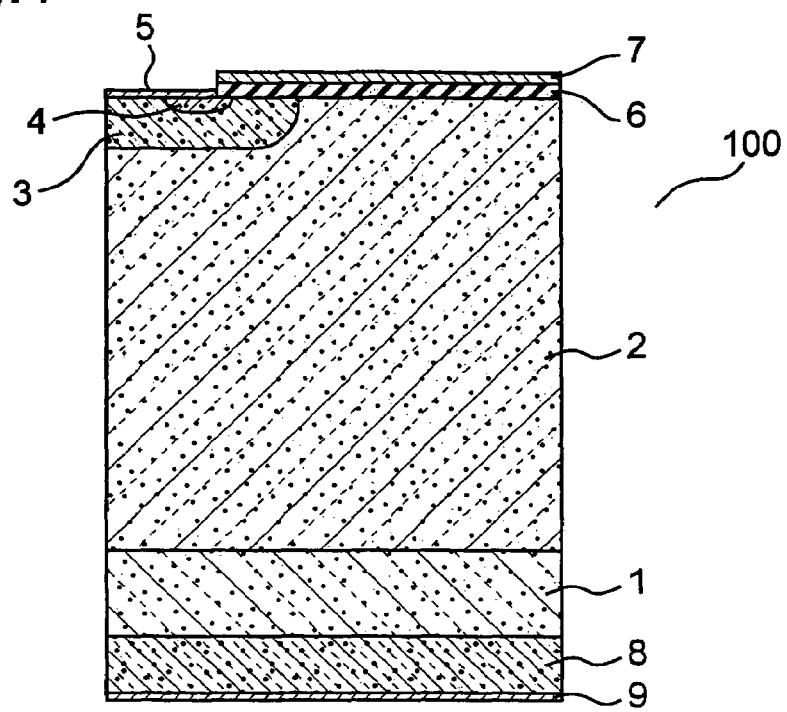
FIG. 1 is a cross section of an Insulated Gate Bipolar Transistor (IGBT) according to Embodiment 1 of the present invention.

Referring to FIGS. 1-5, an Insulated Gate Bipolar Transistor (IGBT) 100 according to Embodiment 1 of the present invention will be described herein. The IGBT 100 includes, in general, an n$^+$-type buffer layer 1 of semiconductor material such as silicon and an n$^-$-type drift layer 2 formed thereon. As illustrated in FIG. 1, the n$^-$-type drift layer 2 includes a p-type base region 3 selectively formed therein, which also includes an n-type emitter region 4 selectively formed. Also, a gate electrode 7 is formed above at least an edge portion of the n-type emitter region 4, the p-type base region 3, and the n$^-$-type drift layer 2, via a gate oxide layer 6. Further, an emitter electrode 5 is formed on and contacting with the n-type emitter region 4 and the p-type base region 3.

Formed on the bottom surface of the n$^+$-type buffer layer 1 is a p$^+$-type collector layer 8, also on which in turn a collector electrode 9 is formed. The emitter electrode 5, the gate electrode 7, and the collector electrode 9 are made of material such as aluminum.

Next, the operation of the IGBT 100 according to the present embodiment will be described herein. Once a voltage is applied between the gate electrode 7 and the emitter electrode 5, the p-type base region 3 serves as a channel region so that a forward base current runs between the n$^-$-type drift layer 2 and the n-type emitter region 4 through the p-type base region 3. The forward base current triggers the IGBT 100 to turn on, allowing the current between the collector electrode 9 and the emitter electrode 5. On the other hand, no voltage or a negative voltage applied between the collector electrode 9 and the emitter electrode 5 turns off the IGBT 100.

Figure 2:
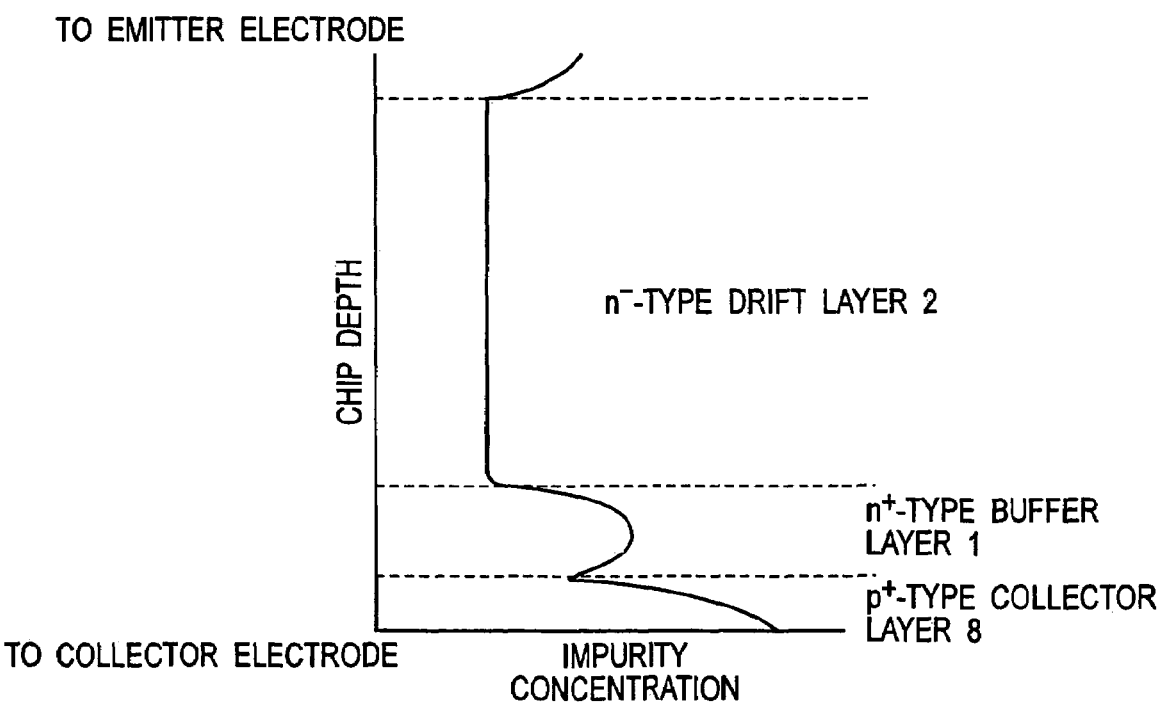
FIG. 2 is a chart showing an impurity concentration profile of the IGBT according to Embodiment 1 of the present invention.

FIG. 2 is a chart showing an impurity concentration profile along the vertical direction of the IGBT 100 according to Embodiment 1, i.e., the p$^+$-type collector layer 8, the n$^+$-type buffer layer 1, and the n$^-$-type drift layer 2. The horizontal and vertical axes represent the impurity concentration and the chip depth, respectively.

According to the IGBT 100 of the present embodiment, the n$^+$-type buffer layer 1 is designed to have the peak (maximal) impurity concentration of $5\times10^{15}$ cm$^{-3}$ or less, and the p$^+$-type collector layer 8 is designed to have the surface (maximal) impurity concentration of $1\times10^{17}$ cm$^{-3}$ or more. Further, the buffer layer 1 and the collector layer 8 are formed such that the ratio of the surface impurity concentration of the collector layer 8 to the peak impurity concentration of the buffer layer 1 is greater than 100. Also, the p$^+$-type collector layer 8 has the diffusion depth of 1 µm or more.

As will be described herein in detail, the IGBT 100 so structured can improve the reverse breakdown voltage allowing the reverse current from the emitter to collector electrode, without deteriorating characteristics of the forward breakdown voltage and the operating voltage.

Figure 3A:
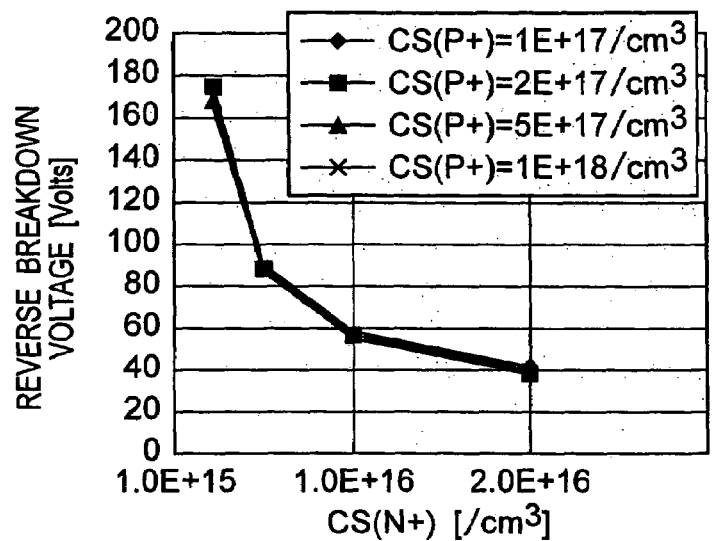
FIGS. 3A-3C are graphs illustrating the relationship between the peak impurity concentration in the n$^+$-buffer and p$^+$-collector layers and reverse breakdown voltages.
Figure 3B:
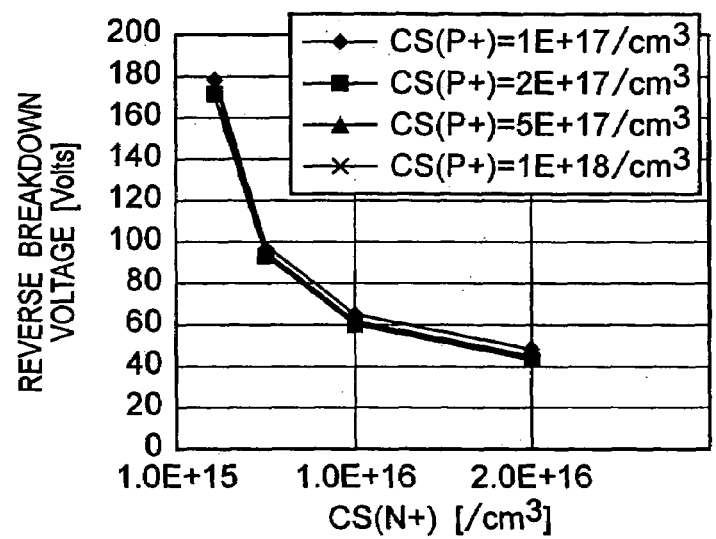
Figure 3C:
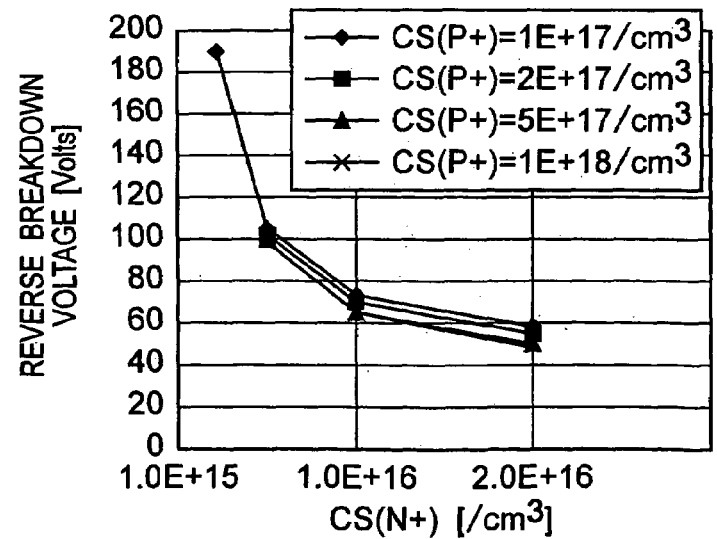

FIGS. 3A-3C illustrate the relationship between the peak (maximal) impurity concentration (CS(N$^+$)) of the N$^+$-type buffer layer 1 and the reverse breakdown voltage for several IGBTs including the p$^+$-type collector layers 8 of which maximal impurity concentration (CS(P$^+$)) vary. Also, FIGS. 3A-3C show the relationship where the p$^+$-type collector layer 8 has the vertical thickness Xj of 0.5 µm, 1.0 µm, and 2.0 µm, respectively.

As shown in FIGS. 3A-3C, while the relationship does not much depend on the thickness Xj of the p$^+$-type collector layer 8. However, the reverse breakdown voltage of the IGBT is generally decreased as the peak impurity concentration of the N$^+$-type buffer layer 1 (CS(N$^+$)) is increased.

Figure 5:
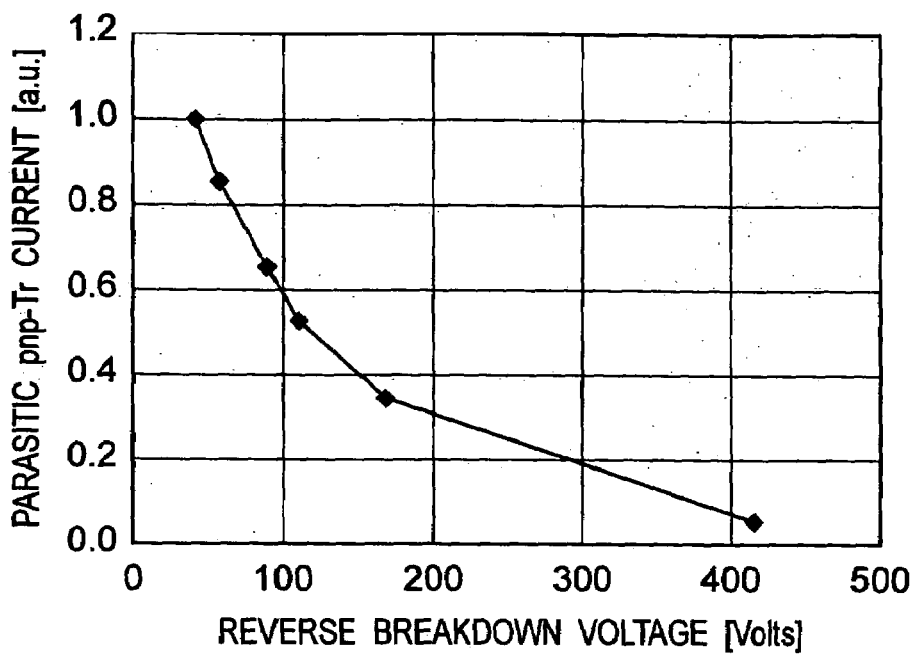
FIG. 5 is a graph illustrating the relationship between the reverse breakdown voltage of the IGBT and the parasitic pnp-Tr current.

Meanwhile, FIG. 5 illustrates the relationship between the reverse breakdown voltage of the IGBT 100 and the relative parasitic pnp-Tr current, where the parasitic pnp-Tr current is set to one (1.0) at the reverse breakdown voltage of about 40 volts of the conventional IGBT 1. In FIG. 5, in order to realize the parasitic pnp-Tr current of 65% or less of the conventional one, the reverse breakdown voltage should be about 90 volts or more.

Back to FIGS. 3A-3C, in order to obtain the reverse breakdown voltage of about 90 volts or more, the peak impurity concentration of the N$^+$-type buffer layer 1 has to be $5\times10^{15}$ cm$^{-3}$ or less.

Figure 4A:
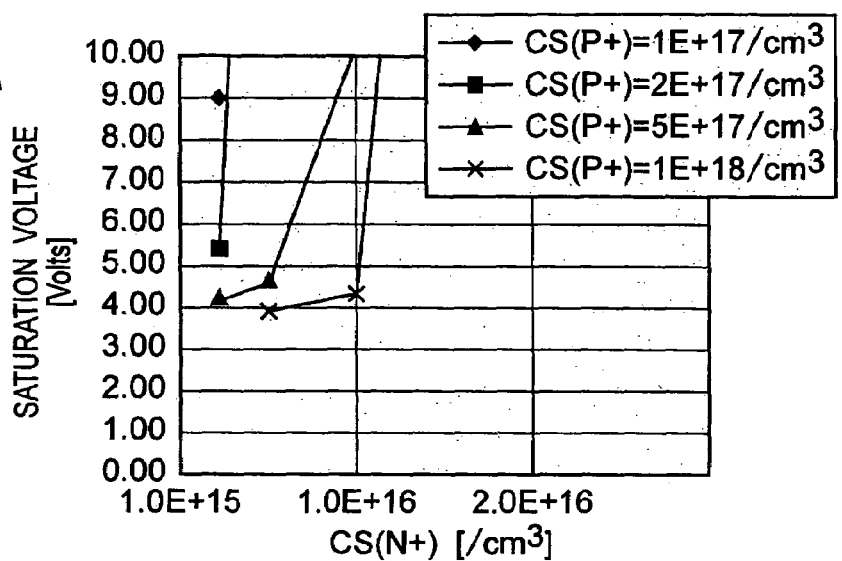
FIGS. 4A-4C are graphs illustrating the relationship between the peak impurity concentration in the n$^+$-buffer and p$^+$-collector layers and saturation voltages.
Figure 4B:
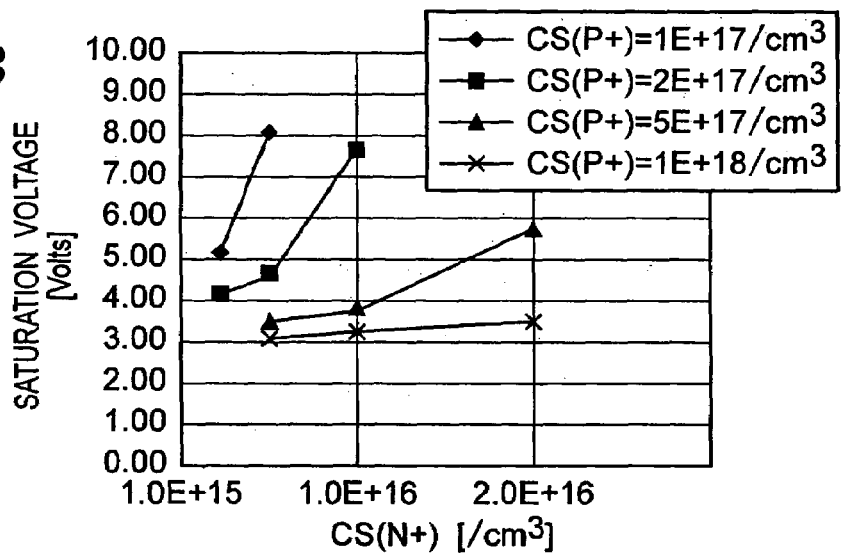
Figure 4C:
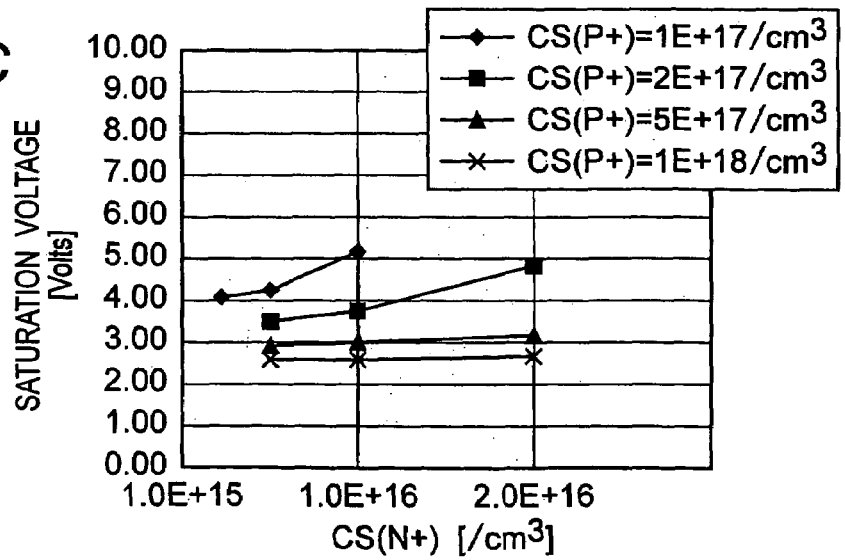

Also, FIGS. 4A-4C illustrate the relationship between the peak (maximal) impurity concentration (CS(N$^+$)) of the N$^+$-type buffer layer 1 and the saturation voltage (operating voltage) for several IGBTs including the p$^+$-type collector layers 8 of which maximal impurity concentration (CS(P$^+$)) vary, where the p$^+$-type collector layer 8 has the vertical thickness Xj of 0.5 µm, 1.0 µm, and 2.0 µm, respectively.

As shown in FIGS. 4A-4C, the maximal impurity concentration (CS(P$^+$)) and the thickness Xj of the p$^+$-type collector layer 8 fairly gives an impact to the saturation voltage especially at the thickness Xj of 0.5 µm (FIG. 4A). In particular, the saturation voltage shown in FIGS. 4B and 4C are less influenced by the thickness Xj of 1.0 µm and 2.0 µm. In particular, when the p$^+$-type collector layer 8 has the peak impurity concentration of $1\times10^{17}$ cm$^{-3}$ or more, the saturation voltage can be controlled within a stable and/or narrow range.

Therefore, according to the IGBT 100 including the N$^+$-type buffer layer with the peak impurity concentration of $5\times10^{15}$ cm$^{-3}$ or less, the p$^+$-type collector layer 8 have the thickness Xj of 1.0 μm or more and the p$^+$-type collector layer 8 has the maximal impurity concentration (CS(P$^+$)) of $1\times10^{17}$ cm$^{-3}$ or more so that the saturation voltage can be controlled within a stable and/or narrow range.

Preferably, the p$^+$-type collector layer 8 is designed to have the maximal impurity concentration (CS(P$^+$)) of $5\times10^{17}$ cm$^{-3}$ or more, so that the ratio of the surface impurity concentration of the collector layer 8 to the peak impurity concentration of the buffer layer 1 is greater than 100. Thus, the saturation voltage can be controlled within a more stable and/or narrower range.

To this end, the IGBT having the improved reverse breakdown voltage and the stable saturation voltage can be realized by controlling the peak (maximal) impurity concentration (CS(N$^+$)) of the N$^+$-type buffer layer 1 as being of $5\times10^{15}$ cm$^{-3}$ or less and the maximal impurity concentration (CS(P$^+$)) of the p$^+$-type collector layer 8 as being of $1\times10^{17}$ cm$^{-3}$ or more, preferably, by controlling the ratio of the surface impurity concentration of the collector layer 8 to the peak impurity concentration of the buffer layer 1 as being greater than 100, and by designing the thickness Xj of the p$^+$-type collector layer 8 as being of 1.0 μm or more.

This reduces the avalanche current of the IGBT 1, i.e., the base current of the parasitic pnp-transistor generated when the IGBT 2 turns off, thereby reducing the power loss and improving the ruggedness of the IGBT.

As described above, when the reverse voltage is applied with the PN junction consisting of the N$^+$-type buffer layer 1 and the p$^+$-type collector layer 8, the suppression of the peak (maximal) impurity concentration (CS(N$^+$)) of the N$^+$-type buffer layer 1 forms an expanded depletion region in the N$^+$-type buffer layer 1 for reducing the electric field strength in the depletion region so that the avalanche current can be reduced. Also, the increase of the maximal impurity concentration (CS(P$^+$)) of the p$^+$-type collector layer 8 reduces the resistance of the collector layer 8 thereby reducing the saturation voltage (dropping voltage in the operating ON-state). Therefore, the IGBT having the improved reverse breakdown voltage can be realized without increasing the operating voltage (saturation voltage).

Figure 14:
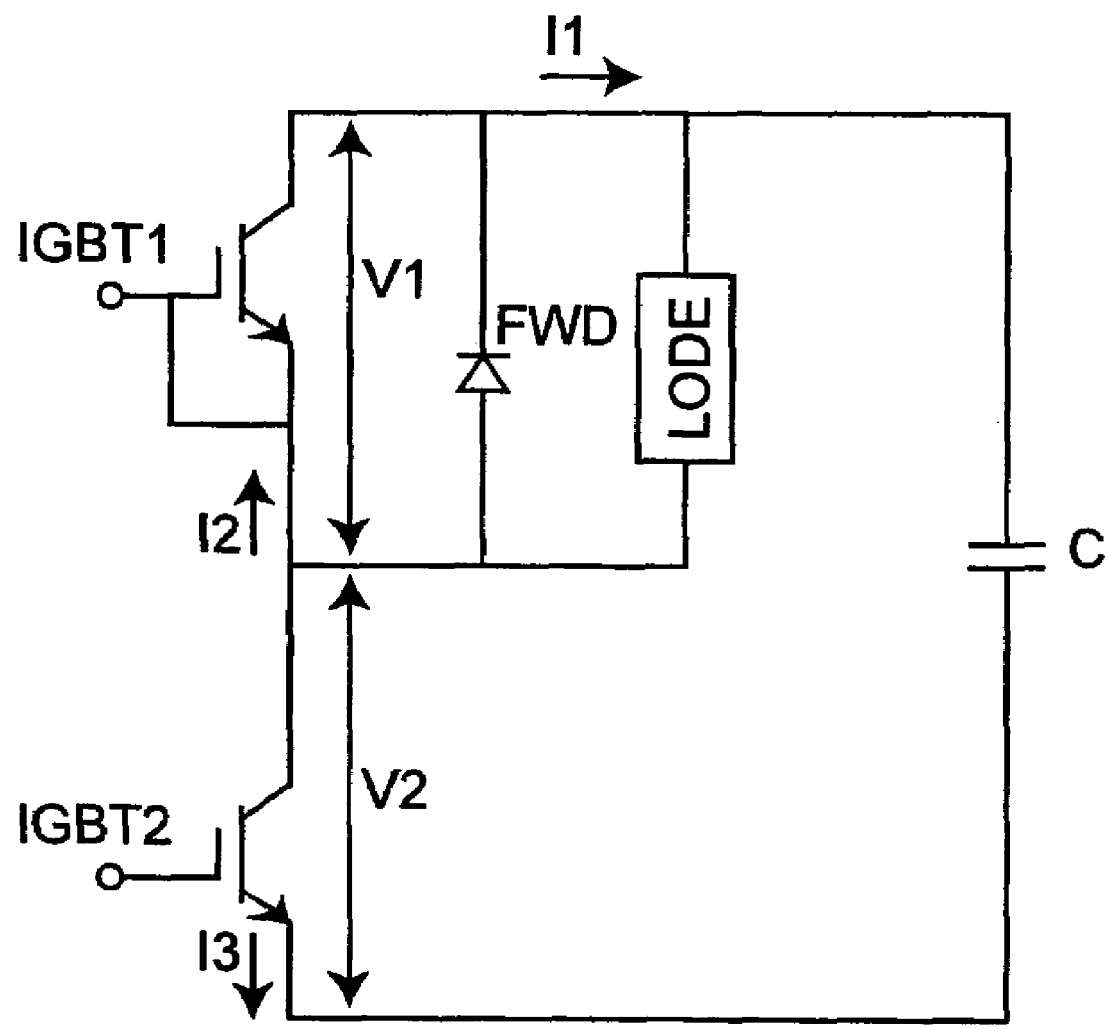
FIG. 14 is a circuit diagram of a conventional power converting circuit with a half-bridge circuit.
Figure 15:
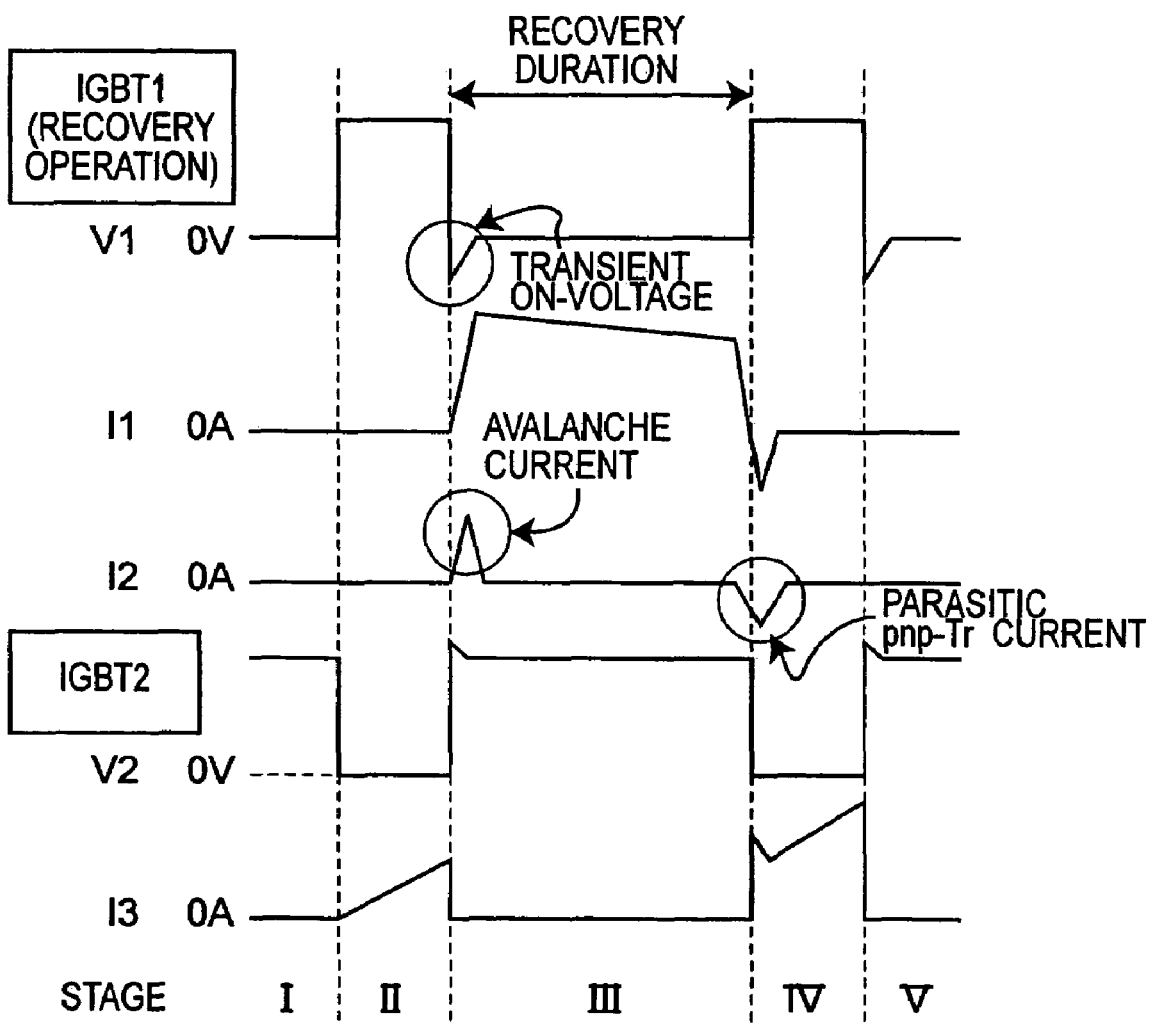
FIG. 15 is a timing diagram showing outputs of the power converting circuit.

When the IGBT 1 so structured is incorporated into the circuit shown in FIG. 14, the reverse breakdown voltage of the IGBT 1 can be higher than that of the ON transient voltage, thus the reverse current through the IGBT 1 due to the recovery operation of the induction load circuit (not shown) is reduced, thereby realizing the IGBT having the reduced power loss and the improved ruggedness.

It should be noted that although the p$^+$-type collector layer 8 generally has the maximal impurity concentration (CS(P$^+$)) at the surface thereof, it may have the maximal impurity concentration at any portions other than the surface. Also, the maximal impurity concentration of the N$^+$-type buffer layer 1 and the p$^+$-type collector layer 8 represents the peak value, and if they are constant, it refers the constant value thereof.

Embodiment 2

Figure 6:
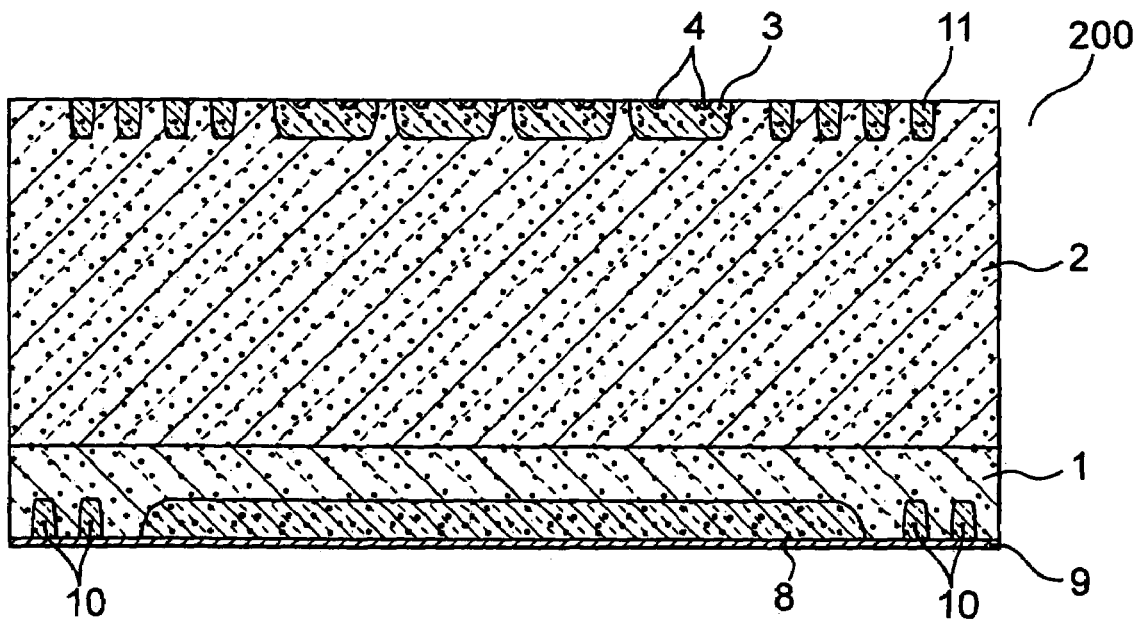
FIG. 6 is a cross section of another IGBT according to Embodiment 2 of the present invention.

Referring to FIG. 6, another Insulated Gate Bipolar Transistor (IGBT) 200 according to Embodiment 2 of the present invention will be described herein. The components shown in FIG. 6 similar to those in FIG. 1 have the reference numerals similar thereto. However, the IGBT 200 is illustrated in FIG. 6 with eliminating the emitter electrode, the gate oxide layer, and the gate electrode.

As illustrated in FIG. 6, the IGBT 200 has one or more p-type guard-rings 11 formed on the top surface of the drift layer 2 for surrounding at least one base region 3. Also, the p$^+$-type collector layer 8 of the IGBT 200 is formed as a well region on the bottom surface of the N$^+$-type buffer layer 1, in which the PN-junction between the collector layer 8 and the N$^+$-type buffer layer 1 is exposed on the bottom surface. This causes the reverse voltage of the IGBT 200 to be unstable depending upon the condition of the bottom surface thereof.

However, the IGBT 200 of Embodiment 2 includes at least one p-type guard-ring 10 formed also on the bottom surface of the IGBT 200 for surrounding the collector layer 8, thereby stabilizing the reverse voltage of the IGBT 200, and reducing the avalanche current through the IGBT 200.

Embodiment 3

Figure 7:
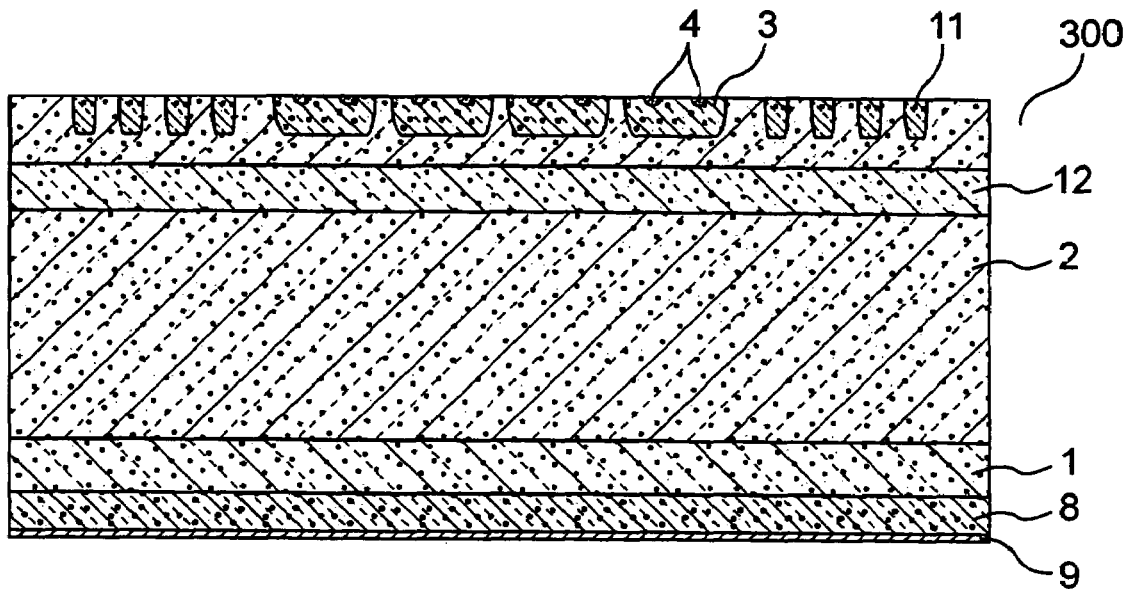
FIG. 7 is a cross section of another IGBT according to Embodiment 3 of the present invention.
Figure 8:
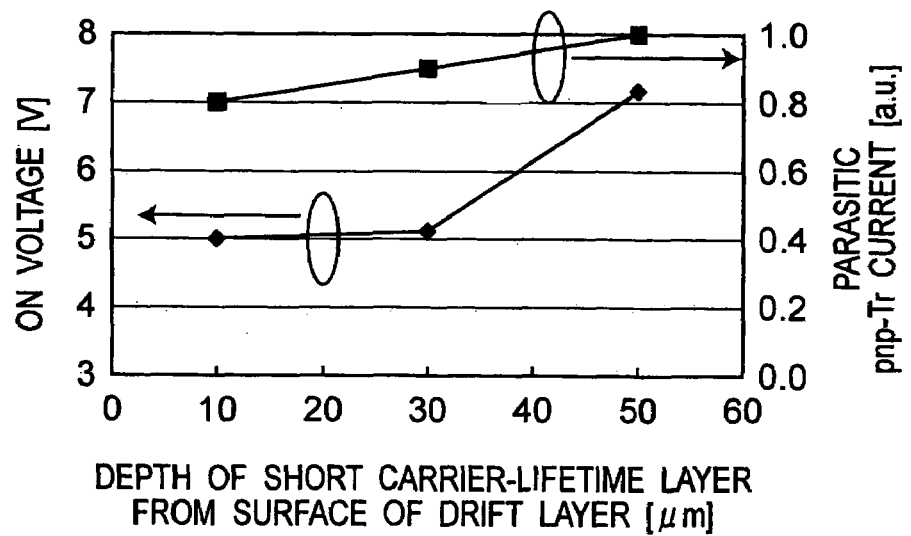
FIG. 8 is a graph illustrating the relationship between the depth of short carrier-lifetime region and the operating voltage/the parasitic pnp-Tr current.

Referring to FIGS. 7-8, another Insulated Gate Bipolar Transistor (IGBT) 300 according to Embodiment 3 of the present invention will be described herein. The components shown in FIG. 7 similar to those in FIG. 1 have the reference numerals similar thereto. However, the IGBT 300 is illustrated in FIG. 7 with eliminating the emitter electrode, the gate oxide layer, and the gate electrode.

As illustrated in FIG. 7, the IGBT 300 has a plurality of annular p-type guard-rings 11 formed on the surface of the drift layer 2. Also, the drift layer 2 includes a short carrier-lifetime region 12 allowing the carrier therein to have the lifetime shorter than in the drift layer 2. Such a short carrier-lifetime region 12 can be formed by radiating radioactive rays and/or particle beams to provide the predetermined region with traps of carrier (electron and hole).

The short carrier-lifetime region 12 traps undesired carrier drifting in the n$^-$-type drift layer 2 so as to eliminate the unnecessary current of the IGBT 300.

FIG. 8 illustrates the operating voltage and the parasitic pnp-Tr current of the IGBT 300 varying with the depth (distance) of the short carrier-lifetime region 12 measured from the top surface of the drift layer 2. As can be seen in FIG. 8, the operating voltage (the forward voltage during the ON-state of the IGBT) is greater as the short carrier-lifetime region 12 is located more deeply. In particular, the short carrier-lifetime region 12 is preferably located at the depth of 40 μm or less, more preferably 30 μm or less, so as to remain the operating voltage to be relatively low. Also, the parasitic pnp-Tr current shows higher, as the short carrier-lifetime region 12 is located more deeply.

Thus, the short carrier-lifetime region 12 of the depth of 40 μm or less keeps the ON-voltage and the parasitic pnp-Tr current to be relatively low.

As above, in the IGBT according to Embodiment 3, the short carrier-lifetime region 12 is formed within the drift layer 2 to trap the carrier even where the reverse avalanche current is generated in the IGBT, thereby preventing the parasitic pnp-Tr current of the IGBT.

Thus, the parasitic pnp-Tr operation of the IGBT is minimized, thereby reducing the loss and improving the ruggedness of the IGBT.

Embodiment 4

Figure 9:
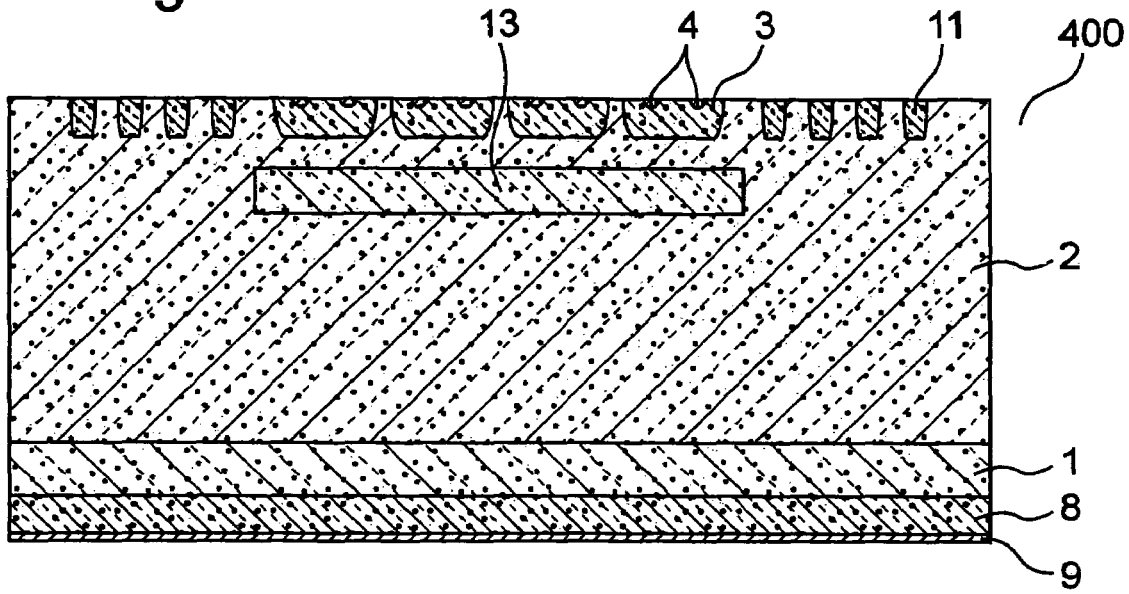
FIG. 9 is a cross section of another IGET according to Embodiment 4 of the present invention.

Referring to FIG. 9, another Insulated Gate Bipolar Transistor (IGBT) 400 according to Embodiment 4 of the present invention will be described herein. The components shown in FIG. 9 similar to those in FIG. 7 have the reference numerals similar thereto. However, the IGBT 400 is illustrated in FIG. 9 with eliminating the emitter electrode, the gate oxide layer, and the gate electrode.

In the IGBT 400 shown in FIG. 9, the short carrier-lifetime region 13 is formed only beneath the cell portion (including the base region 3 with the n⁻-emitter region 4). Besides, the remaining structure of the IGBT 400 is the same as that of the IGBT 300.

The short carrier-lifetime region 13 of the present embodiment is located intervening in the current path between the cell portion and the collector electrode 9. Thus, the undesired carrier drifting through the short carrier-lifetime region 13 is effectively trapped while preventing the increase of the operating voltage (the forward dropping voltage during the ON condition of the IGBT). This suppresses the parasitic pnp-Tr operation so as to reduce the loss and improve the ruggedness of the IGBT.

Embodiment 5

Figure 10:
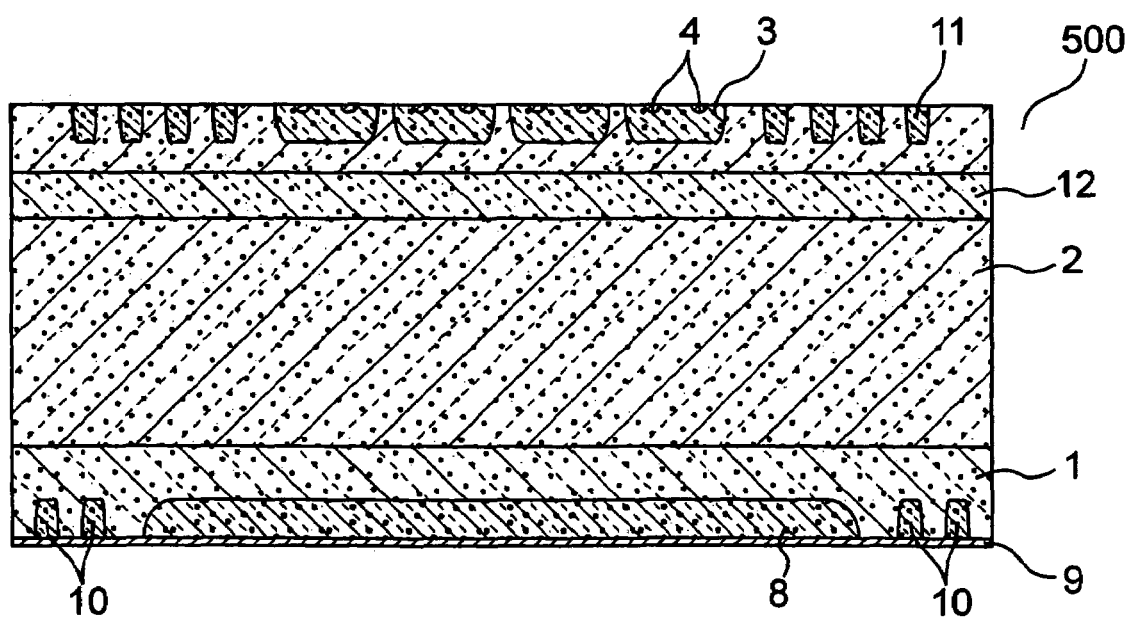
FIG. 10 is a cross section of another IGET according to Embodiment 5 of the present invention.

Referring to FIG. 10, another Insulated Gate Bipolar Transistor (IGBT) 500 according to Embodiment 5 of the present invention will be described herein. The components shown in FIG. 10 similar to those in FIG. 7 have the reference numerals similar thereto. However, the IGBT 500 is illustrated in FIG. 10 with eliminating the emitter electrode, the gate oxide layer, and the gate electrode.

The IGBT 500 of the present embodiment includes both the guard-ring 10 similar to one of the IGBT 200 and the short carrier-lifetime region 12 similar to one of the IGBT 300. Thus, the IGBT 500 so structured can stabilize the reverse breakdown voltage and also suppress the parasitic pnp-Tr operation. It should be noted that the short carrier-lifetime region 12 can be formed only beneath the cell portion (including the base region 3 with the n⁻-emitter region 4) as the IGBT 400.

Embodiment 6

Figure 11:
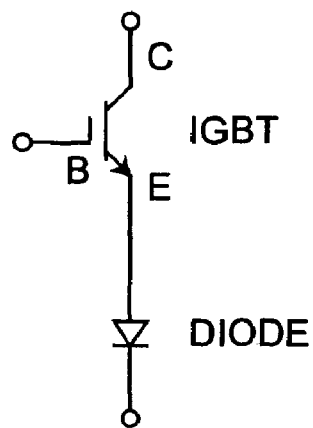
FIG. 11 is circuit diagram of another semiconductor device according to Embodiment 6 of the present invention.
Figure 12:
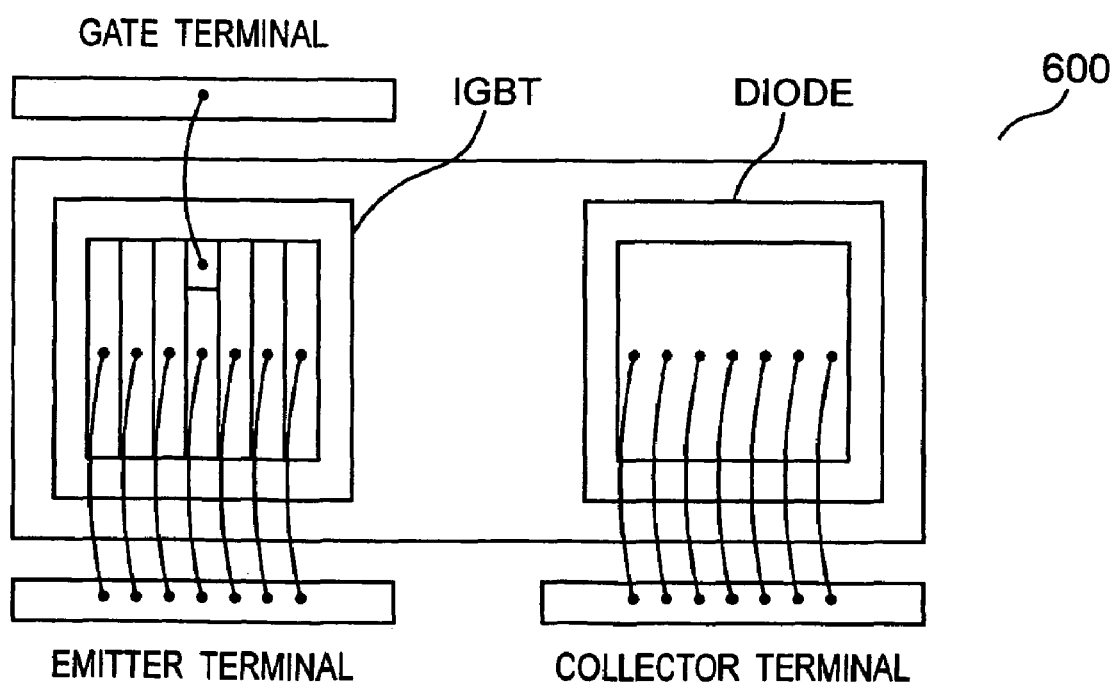
FIG. 12 is a top plan view of the IGBT according to Embodiment 6 of the present invention.

Referring to FIGS. 11-12, a semiconductor device according to Embodiment 6 of the present invention will be described herein. The semiconductor device 600 shown in FIG. 11 includes a diode connected in series between the collector terminal (c) of the IGBT and the load (not shown) The diode has the reverse breakdown voltage of, for example, about 300 volts. This additional diode has an effect similar to the case where the reverse breakdown voltage is improved, i.e., preventing the avalanche current running into the collector terminal of the IGBT.

The IGBT includes the gate electrode and the emitter electrode formed on the top surface, which are connected via bonding-wires of aluminum with the gate terminal and the emitter terminal, respectively. Also, the collector electrode formed on the bottom surface of the IGBT is electrically connected with the cathode electrode of the diode. Further, the anode electrode of the diode is electrically connected via bonding-wires of metal such as aluminum with the collector electrode.

The inverter device as illustrated in FIG. 14 can be realized by directly connecting the emitter and collector terminals across the load and by connecting the gate terminal with a gate signal line.

As above, the semiconductor device including the IGBT and the diode connected in series can prevent the avalanche current from running into the collector electrode, thereby suppressing the parasitic pnp-Tr current. This prevents the parasitic pnp-Tr operation, thereby to reduce the power loss and improve the ruggedness of the IGBT. To this end, since the parasitic pnp-Tr current of the IGBT can be suppressed by connecting the diode via bonding-wires, the inverter device with the improved breakdown voltage can readily be achieved.

Embodiment 7

Figure 13:
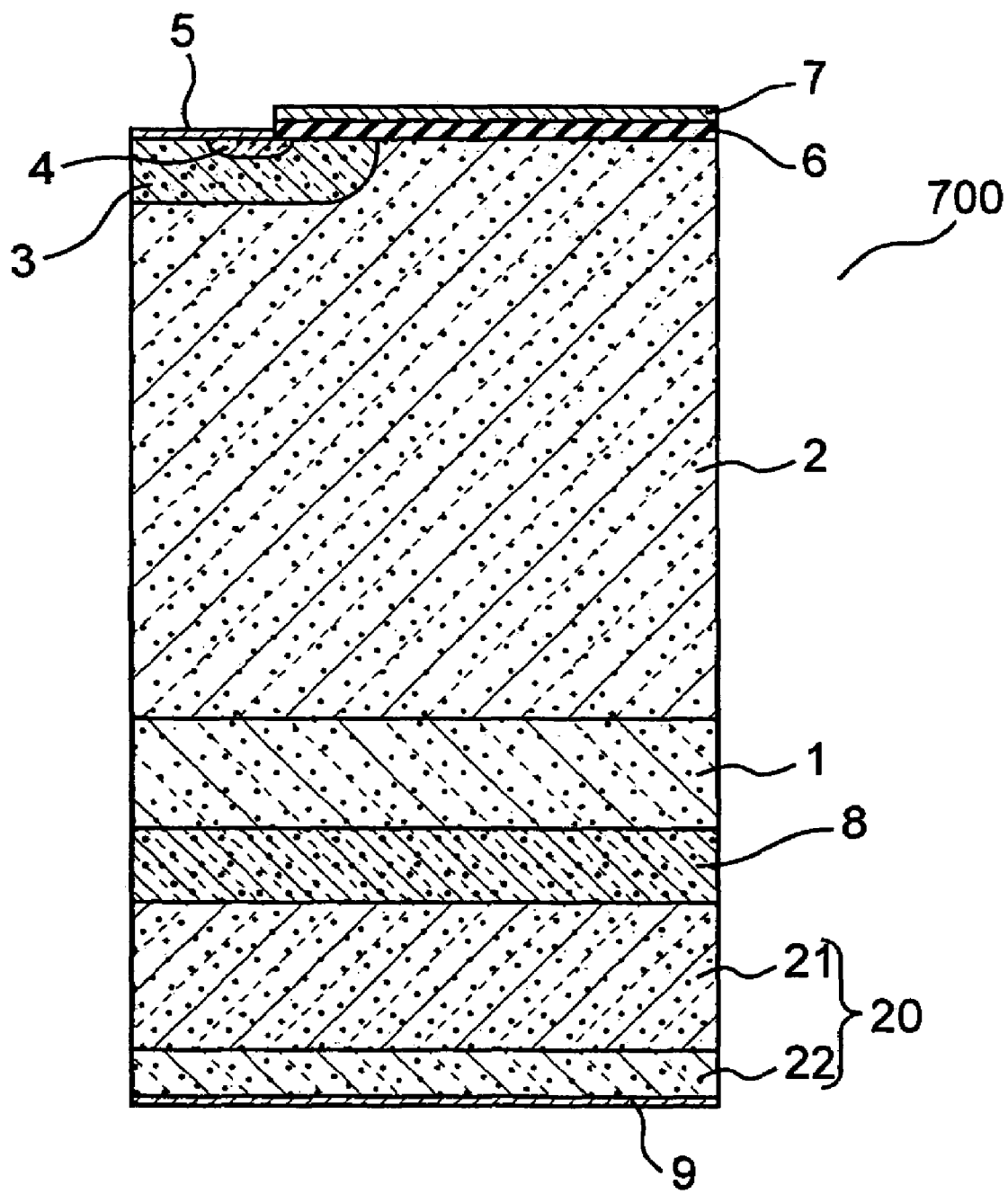
FIG. 13 is a cross section of another IGBT according to Embodiment 6 of the present invention.

Referring to FIG. 13, another Insulated Gate Bipolar Transistor (IGBT) according to Embodiment 7 of the present invention will be described herein. The components shown in FIG. 13 similar to those in FIG. 1 have the reference numerals similar thereto. The semiconductor device 700 shown in FIG. 13 also includes a diode 20 consisting of n⁻-type and p⁻-type layers 21, 22, which are sandwiched between the p⁺-type collector layer 8 and the collector electrode 9.

In the semiconductor device 700, the IGBT and the diode are integrated as one chip to achieve the circuit diagram as shown in FIG. 11, thereby downsizing the semiconductor device 700. Also, this eliminates the inductance with the bonding-wires as required in Embodiment 6, and shortens the turn-on time in a forward direction of the diode. Also, the one chip integration leads the area of the device to be downsized.

The IGBT and the diode may be integrated in one semiconductor manufacturing process, or may be separately produced and bonded to each other with any conductive adhesive.

What is claimed is:

1. A semiconductor device, comprising:
   a semiconductor layer of a first conductive type having first and second surfaces, said semiconductor layer including a base region of a second conductive type formed in the first surface and an emitter region of the first conductive type formed in said base region;
   a buffer layer of the first conductive type formed on the second surface of said semiconductor layer; and
   a collector layer of the second conductive type formed on said buffer layer,
   said semiconductor layer further including a short carrier-lifetime layer formed therein and located between said base region and said buffer layer, and
   said short carrier-lifetime layer being spaced from the first surface of said semiconductor layer by a distance of approximately 30 μm or less.

2. The semiconductor device according to claim 1, wherein said short carrier-lifetime layer is formed beneath said base region.

3. The semiconductor device according to claim 1, further comprising a diode connected in series with said collector layer via a wire.

4. The semiconductor device according to claim 1, further comprising a first diode layer of the first conductive type and a second diode layer of the second conductive type, said first and second diode layers being intervened between said buffer layer and said collector layer.

5. A semiconductor device, comprising:
   a semiconductor layer of a first conductive type having first and second surfaces, said semiconductor layer including a base region of a second conductive type formed in the first surface and an emitter region of the first conductive type formed in said base region;
   a buffer layer of the first conductive type formed on the second surface of said semiconductor layer, said buffer layer including a collector region of the second conductive type formed in said buffer layer;

said semiconductor layer further including a short carrier-lifetime layer formed therein and located between said base region and said buffer layer; and said short carrier-lifetime layer being spaced from the first surface of said semiconductor layer by a distance of approximately 30 μm or less.

6. The semiconductor device according to claim 5, wherein said short carrier-lifetime layer is formed beneath said base region.

7. The semiconductor device according to claim 5, further comprising a diode connected in series with said collector region via a wire.

8. The semiconductor device according to claim 5, further comprising a first diode layer of the first conductive type and a second diode layer of the second conductive type, said first and second diode layers being intervened between said buffer layer and said collector region.

\* \* \* \* \*